(12) United States Patent
Kang

(10) Patent No.: US 7,609,540 B2
(45) Date of Patent: Oct. 27, 2009

(54) SERIAL BUS CONTROLLER USING NONVOLATILE FERROELECTRIC MEMORY

(75) Inventor: Hee Bok Kang, Daejeon (KR)

(73) Assignee: Hynix Semiconductor Inc., Icheon-si (KR)

( * ) Notice: Subject to any disclaimer, the term of this patent is extended or adjusted under 35 U.S.C. 154(b) by 123 days.

(21) Appl. No.: 11/826,217

(22) Filed: Jul. 13, 2007

(65) Prior Publication Data

US 2007/0263424 A1 Nov. 15, 2007

Related U.S. Application Data

(62) Division of application No. 11/363,172, filed on Feb. 28, 2006, now abandoned, which is a division of application No. 10/730,069, filed on Dec. 9, 2003.

(30) Foreign Application Priority Data

Jan. 24, 2003 (KR) .............. 10-2003-0004827

(51) Int. Cl.
*G11C 11/22* (2006.01)
(52) U.S. Cl. .............. 365/145; 710/40; 710/41; 710/107; 710/110
(58) Field of Classification Search .............. 710/40, 710/41, 107, 110; 365/145
See application file for complete search history.

(56) References Cited

U.S. PATENT DOCUMENTS

| 5,613,157 | A | 3/1997 | Davidson et al. |
| 5,684,753 | A | 11/1997 | Hashimoto et al. |
| 6,067,244 | A | 5/2000 | Ma et al. |
| 6,201,423 | B1 * | 3/2001 | Taguchi et al. .............. 327/141 |
| 6,208,582 | B1 | 3/2001 | Kanda et al. |
| 6,301,145 | B1 | 10/2001 | Nishihara |
| 6,304,923 | B1 * | 10/2001 | Klein .............. 710/41 |
| 6,314,016 | B1 | 11/2001 | Takasu |
| 6,363,437 | B1 | 3/2002 | Ptasinski et al. |
| 6,415,339 | B1 | 7/2002 | Farmwald et al. |
| 6,425,033 | B1 | 7/2002 | Conway et al. |
| 6,426,916 | B2 | 7/2002 | Farmwald et al. |
| 6,480,946 | B1 * | 11/2002 | Tomishima et al. .............. 711/167 |
| 6,795,327 | B2 | 9/2004 | Deng et al. |
| 6,944,695 | B1 * | 9/2005 | Tangen .............. 710/107 |
| 7,269,048 | B2 * | 9/2007 | Takashima .............. 365/145 |
| 2005/0122764 | A1 | 6/2005 | Takashima |

FOREIGN PATENT DOCUMENTS

KR 1020040059009 A 7/2004

* cited by examiner

*Primary Examiner*—VanThu Nguyen
(74) *Attorney, Agent, or Firm*—Townsend and Townsend and Crew LLP

(57) ABSTRACT

A serial bus controller using a nonvolatile ferroelectric memory is provided. The memory controller structure using a nonvolatile ferroelectric register enables control of variable access time according to addresses when data are exchanged through a serial bus. In the serial bus controller according to an embodiment of the present invention, access latency time by addresses is programmed using a nonvolatile ferroelectric register, and address access time is differently controlled depending on the programmed access latency when data are exchanged between a master and a FRAM chip through a serial bus, thereby improving system performance.

4 Claims, 18 Drawing Sheets

SERIAL BUS CONTROLLER USING NONVOLATILE FERROELECTRIC MEMORY

CORRESPONDING RELATED APPLICATION

This application is a divisional of U.S. application Ser. No. 11/363,172 filed Feb. 28, 2006 now abandoned, which is a divisional of U.S. application Ser. No. 10/730,069 filed on Dec. 9, 2003, which claims priority to Korean Patent Application No. 2003-0004827 filed Jan. 24, 2003, which are hereby incorporated by reference in their entirety.

BACKGROUND OF THE INVENTION

1. Field of the Invention

The present invention generally relates to a serial bus controller using a nonvolatile ferroelectric memory, and more specifically, to a memory controller using a nonvolatile ferroelectric register which is configured to adjust variable access time according to addresses when data are exchanged through a serial bus.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

In a conventional FRAM, since a column addressing as a page address does not require an extra sensing process during data access, data stored in a sense amplifier page buffer are immediately outputted.

However, during data access, a row addressing further performs an operation of sensing and amplifying data stored in a cell and an operation of maintaining the data in a sense amplifier for a predetermined time. In another row addressing after a row addressing, restore time (precharge time) is added to the row access time. As a result, the row address requires more data access time than the column address. Therefore, in the conventional FRAM, the access time is ineffectively controlled regardless of kinds of address during data access, which results in degradation of reliability of a memory chip.

As a result, an apparatus is required wherein unnecessary data access time may be reduced by controlling interface with a serial bus using the FRAM and program data stored in a memory may be preserved when a power is turned off.

SUMMARY OF THE INVENTION

Accordingly, it is an object of the present invention to provide a memory controller using a nonvolatile ferroelectric register wherein variable access time according to addresses is adjusted when data are exchanged through a serial bus to improve system performance.

In an embodiment, a serial bus controller using a nonvolatile ferroelectric memory comprises a sense amplifier buffer unit, a data bus unit, a data input/output buffer unit, a parallel/serial conversion controller and a write protecting controller. The sense amplifier buffer unit amplifies data applied from a plurality of cell array blocks. The data bus unit exchanges data between the plurality of cell array blocks and the sense amplifier buffer unit. The data input/output buffer unit buffers data inputted/outputted in the data bus unit. The parallel/serial conversion controller interconverts serial data inputted corresponding to serial clock signals with parallel data applied from the data input/output buffer unit. The write protecting controller prevents data from being written in a corresponding sector of the plurality of cell array block when a write protecting command is set.

In another embodiment, a serial bus controller using a nonvolatile ferroelectric memory comprises a master, a FRAM chip and a memory controller. The master outputs serial data/address corresponding to serial clock signals into a serial bus. The FRAM chip controls read/write operations of the memory depending on serial data/address and the serial clock signal received through the serial bus. The memory controller controls a response cycle of the serial clock signal depending on a code programmed in a nonvolatile ferroelectric memory to control access latency time differently according to kinds of address between the master and the FRAM chip.

In still another embodiment, a serial bus controller using a nonvolatile ferroelectric memory comprises a memory controller and a FRAM chip. The memory controller programs a code to control access latency time differently according to kinds of address in a nonvolatile ferroelectric memory, and outputs a response signal to confirm completion of transmission of serial data/address when the serial data/address are transmitted in response to serial clock signals received through a serial bus. The FRAM chip performs read/write operations of the memory during a pulse interval of the response signal. The memory controller controls the pulse interval of the response signal with a first cycle when a row address is transmitted, and controls the pulse interval of the response signal with a second cycle shorter than the first cycle when a column address is transmitted.

DETAILED DESCRIPTION OF THE PREFERRED EMBODIMENTS

The present invention will be described in detail with reference to the accompanying drawings.

Figure 1:
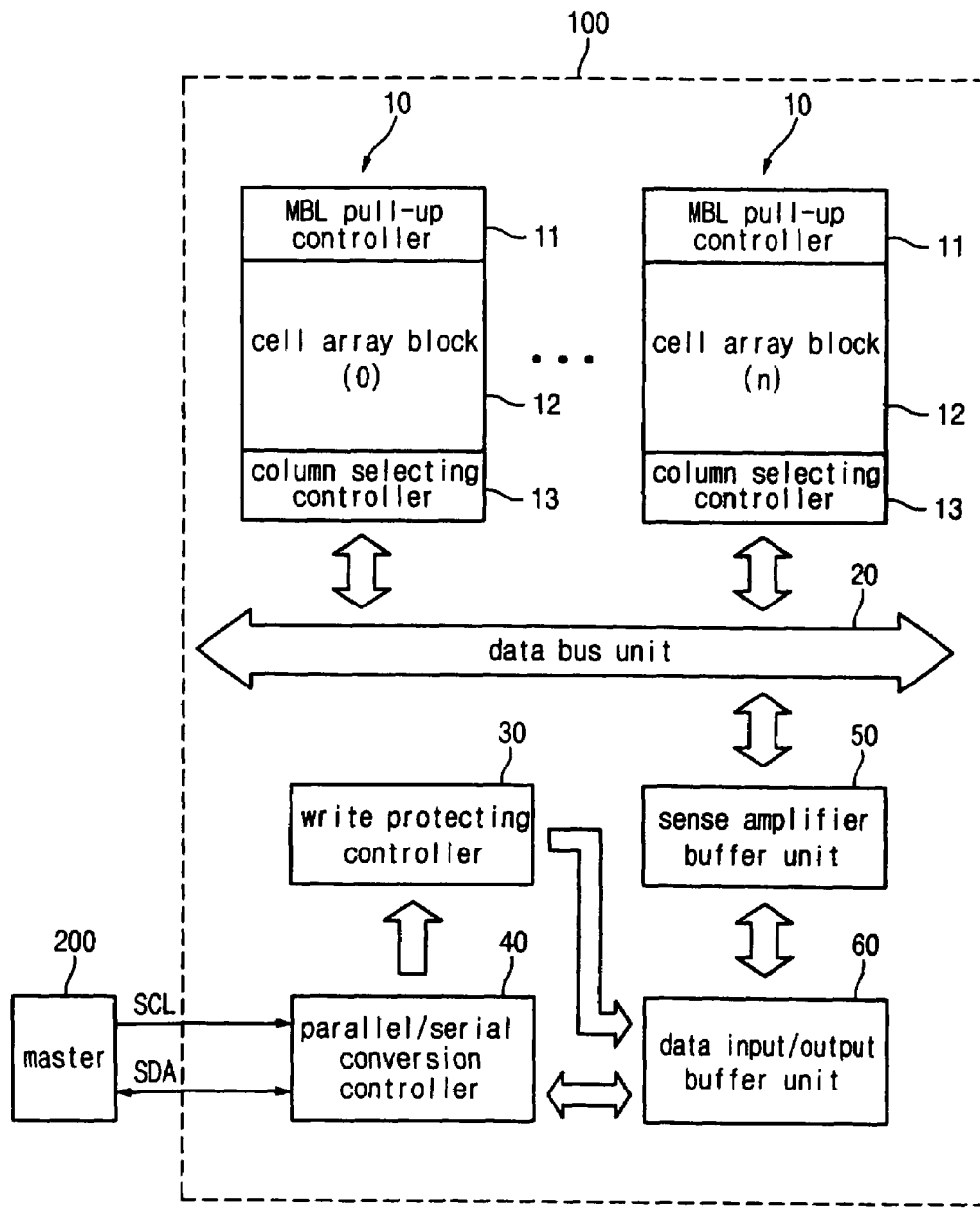
FIG. 1 is a block diagram illustrating a serial bus controller using a nonvolatile ferroelectric memory according to an embodiment of the present invention.

FIG. 1 is a block diagram illustrating a serial bus controller using a nonvolatile ferroelectric memory according to an embodiment of the present invention.

In an embodiment, the serial bus controller comprises a FRAM chip 100 and a master (CPU; Central Processing Unit) 200.

The FRAM chip 100 comprises a plurality of memory blocks 10, a data bus unit 20, a write protecting controller 30, a parallel/serial conversion controller 40, a sense amplifier buffer unit 50 and a data input/output buffer unit 60. Each memory block comprises a MBL (Main Bitline) pull-up controller 11, a cell array block 12 and a column selecting controller 13.

The plurality of memory blocks 10 share data bus unit 20 connected to the sense amplifier buffer unit 50. The sense amplifier buffer unit 50 is connected to the data input/output buffer unit 60 connected to the parallel/serial conversion controller 40 and the write protecting controller 30. The parallel/serial conversion controller 40 is connected to the write protecting controller 30 which prevents data from being written in the memory block 10.

The parallel/serial conversion controller 40 connected to a serial bus through a clock and data input/output pin receives serial clock (SCL) signals and serial data/address (SDA) from the master 200.

Figure 2:
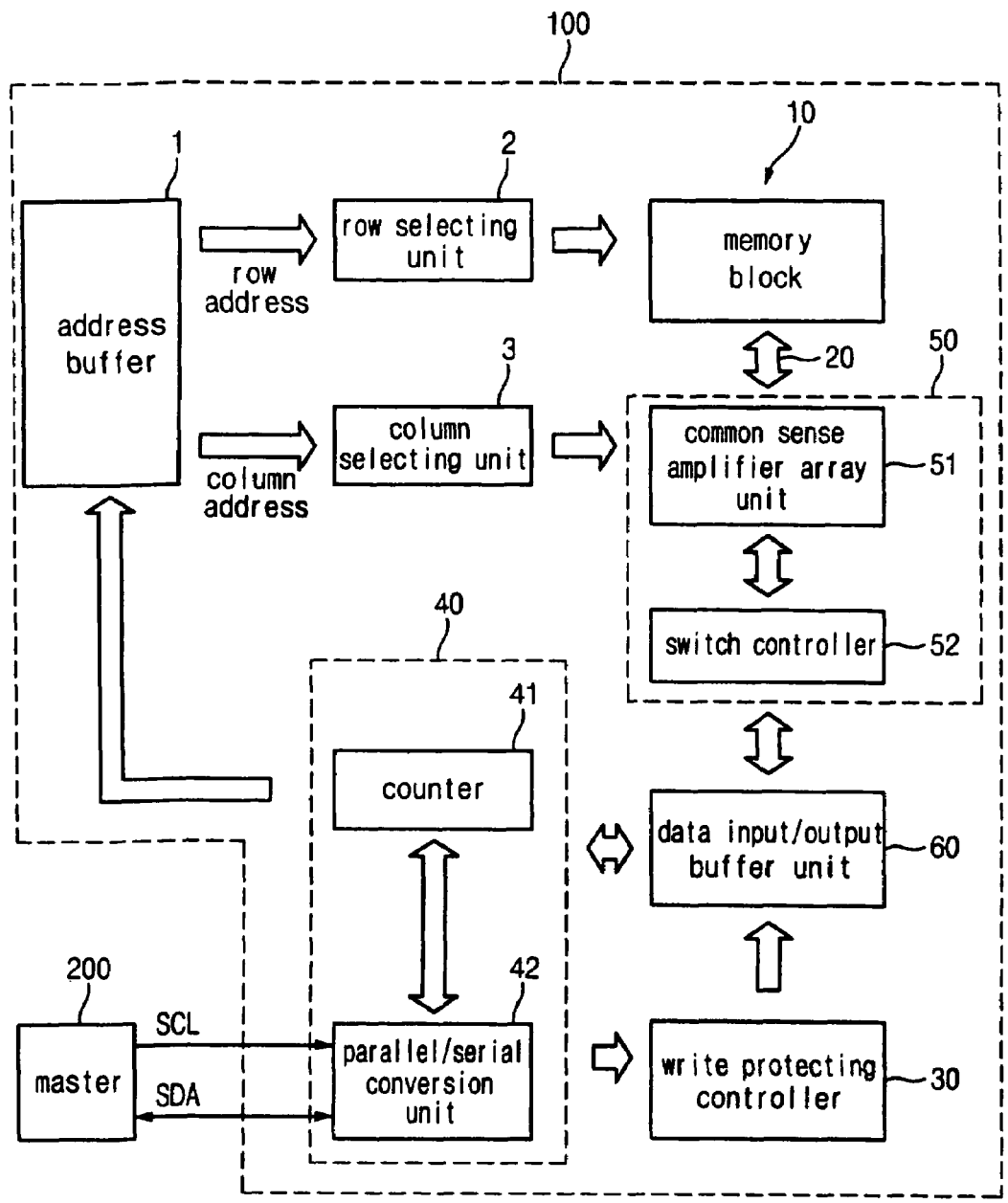
FIG. 2 is a block diagram illustrating a FRAM chip of FIG. 1.

FIG. 2 is a block diagram illustrating the FRAM chip 100 of FIG. 1.

The FRAM chip 100 comprises an address buffer 1, a row selecting unit 2, a column selecting unit 3, the memory block 10, the data bus unit 20, the write protecting controller 30, the parallel/serial conversion controller 40 and the sense amplifier buffer unit 50 and the data input/output buffer unit 60.

The row selecting unit 2 selects a corresponding row address of row addresses applied from the address buffer 1, and outputs the selected row address into the memory block 10. In the memory block 10, a row address is activated by the corresponding row address applied from the row selecting unit 2. The selected row address is outputted into the sense amplifier buffer unit 50, and then amplified/stored. The column selecting unit 3 selects one of column addresses applied from the address buffer 1, and outputs the selected column address into the sense amplifier buffer unit 50.

The sense amplifier buffer unit 50 comprises a common sense amplifier array unit 51 to receive the selected column address, and a switch controller 52. When a corresponding column address is activated, the common sense amplifier array unit 51 outputs data of byte width or word width into the data input/output buffer unit 60 through the switch controller 52.

The parallel/serial conversion controller 40 comprises a counter 41 and a parallel/serial conversion unit 42. The counter 41 counts a corresponding address when consecutive address/data are transmitted in a burst mode to increase the address automatically. The parallel/serial conversion unit 42 converts serial data received from the master 200 into parallel data, and outputs the parallel data into the write protecting controller 30 and the data input/output buffer unit 60.

When a write protecting command is set, the write protecting controller 30 prevents data from being written in a corresponding sector of the memory block 10. As a result, data are only read.

Figure 3:
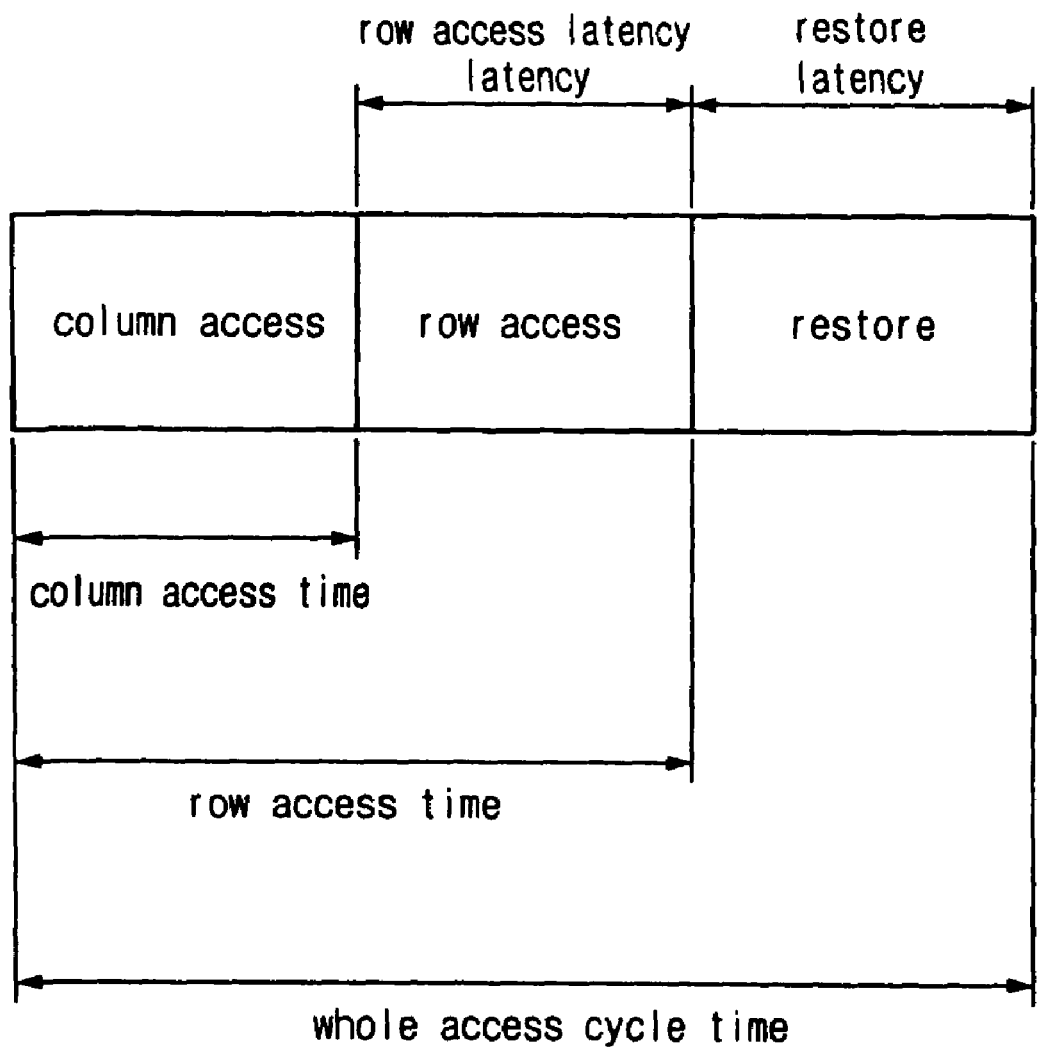
FIG. 3 is a diagram illustrating the access time of the serial bus controller using the nonvolatile ferroelectric memory according to an embodiment of the present invention.

FIG. 3 is a diagram illustrating the access time of the serial bus controller using the nonvolatile ferroelectric memory according to an embodiment of the present invention.

Since data stored in the sense amplifier buffer unit 50 are immediately outputted when a column address is accessed, the column access time is short. On the other hand, since data of a memory cell are sensed and amplified when a row address is accessed, the row access time (row access latency time) is longer than the column access time.

If an operation cycle of a memory access is to be completed, cell data destroyed in the memory cell sensing process are written to be restored. Such time is called as 'precharge time'. Restore latency time is further required to restore cell data in a memory access.

The whole access time is determined by the number of cases as shown above in configuration of one address access cycle.

The row access time is required to access a row address. When a column address is changed in the same row address, the column access time is additionally required. When a row address inputted after an initial address access cycle is changed, restore latency time and new row access time are required. As a result, the whole access cycle time is required to access all addresses.

Accordingly, serial data interface between the master 200 and the FRAM chip 100 is differently controlled by address type, thereby improving system performance.

Figure 4:
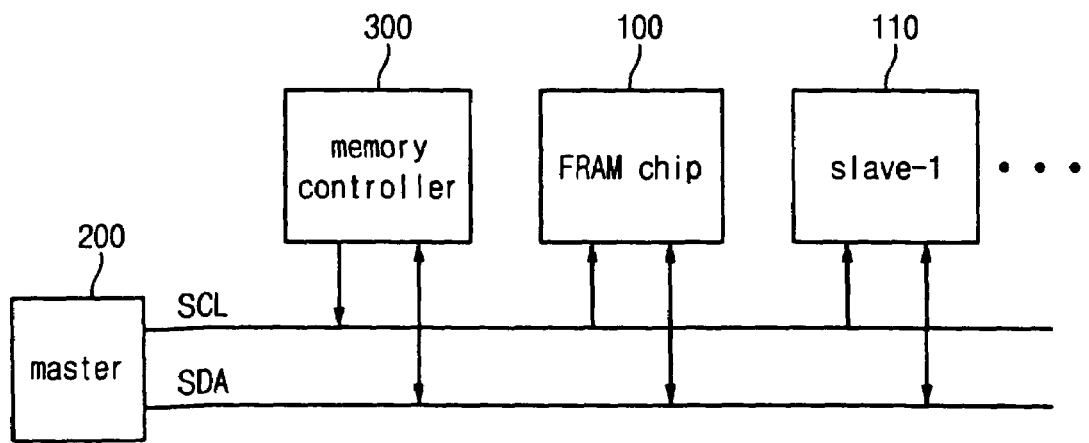
FIG. 4 is a block diagram illustrating a serial bus controller using a nonvolatile ferroelectric memory according to another embodiment of the present invention.

FIG. 4 is a block diagram illustrating a serial bus controller using a nonvolatile ferroelectric memory according to another embodiment of the present invention.

In another embodiment, the serial bus controller comprises a FRAM chip 100, a plurality of slaves 110, a master 200 and a memory controller 300.

The memory controller 300 controls a serial bus between the FRAM chip 100 and the master 200 in order to exchange a serial clock signal SCL and serial data/address SDA.

Figure 5:
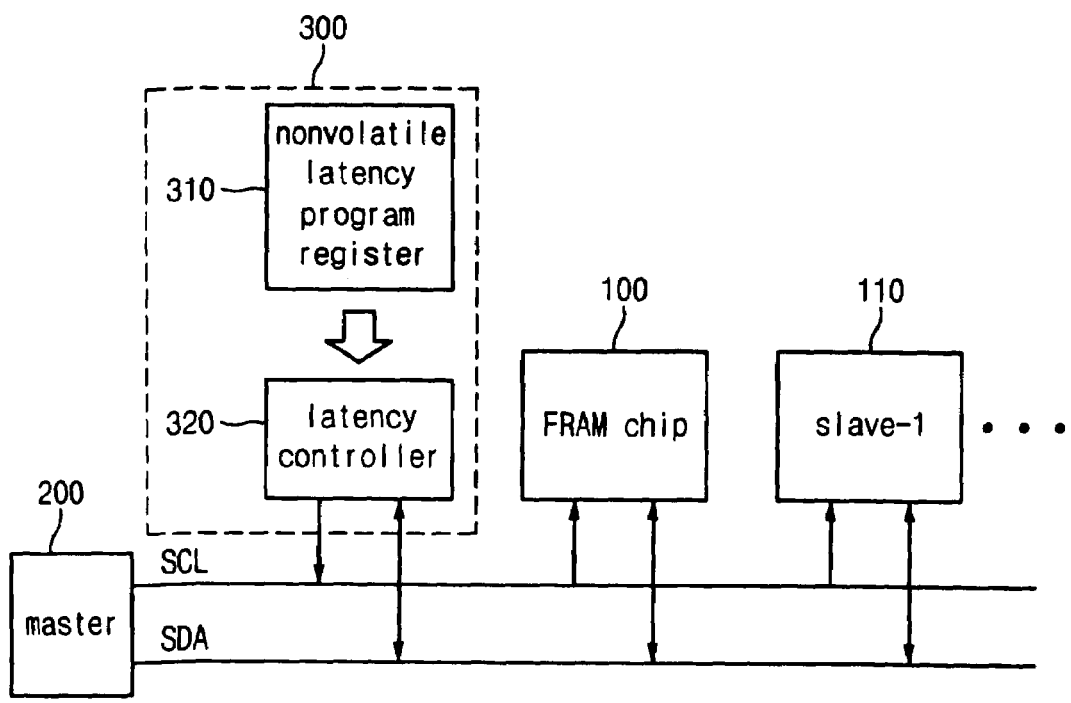
FIG. 5 is a block diagram illustrating a memory controller of FIG. 4.

FIG. 5 is a block diagram illustrating the memory controller 300 of FIG. 4.

The memory controller 300 comprises a nonvolatile latency program register 310 and a latency controller 320.

The nonvolatile latency program register 310 comprising a nonvolatile ferroelectric register stores program data to set latency time of row/column address. The latency controller 320 compares a corresponding address with latency program data stored in the nonvolatile program register 310 to generate a latency response control signal.

Figure 6:
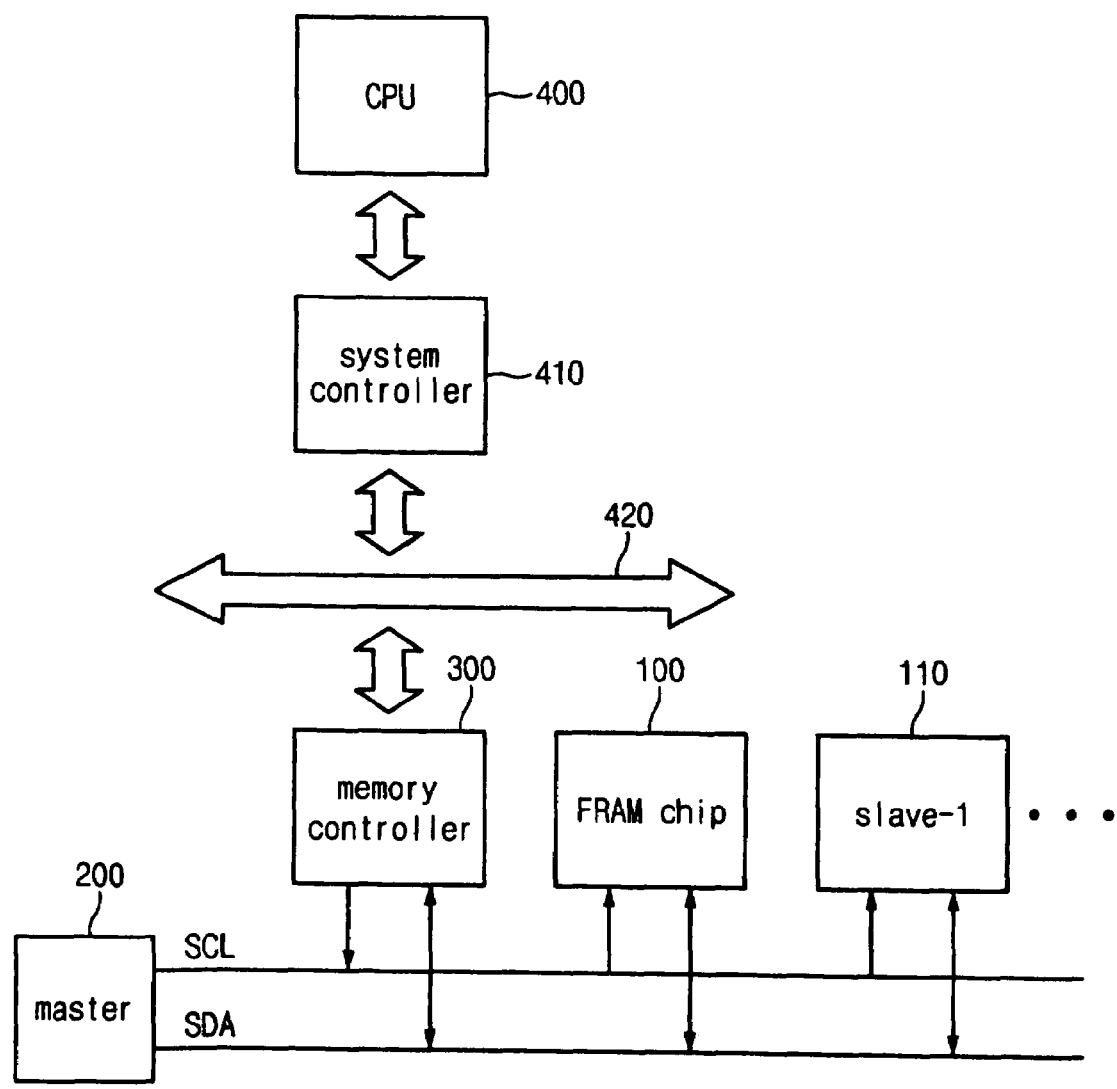
FIG. 6 is a block diagram illustrating a serial bus controller using a nonvolatile ferroelectric memory according to still another embodiment of the present invention.

FIG. 6 is a block diagram illustrating a serial bus controller using a nonvolatile ferroelectric memory according to still another embodiment of the present invention.

In still another embodiment, the serial bus controller comprises a FRAM chip 100, a plurality of slaves 110, a mater 200, a memory controller 300, a CPU 400, a system controller 410 and a PCI (Peripheral Component Interface) bus 420.

The memory controller 300 controls a serial bus between the FRAM chip 100 and the master 200 in order to exchange a serial clock signal SCL and serial data/address SDA. The memory controller 300 is interconnect to the CPU (Central Processing Unit) 400 and the system controller 410 through the PCI bus 420. The PCI bus 420 is controlled by the system controller 410.

Figure 7:
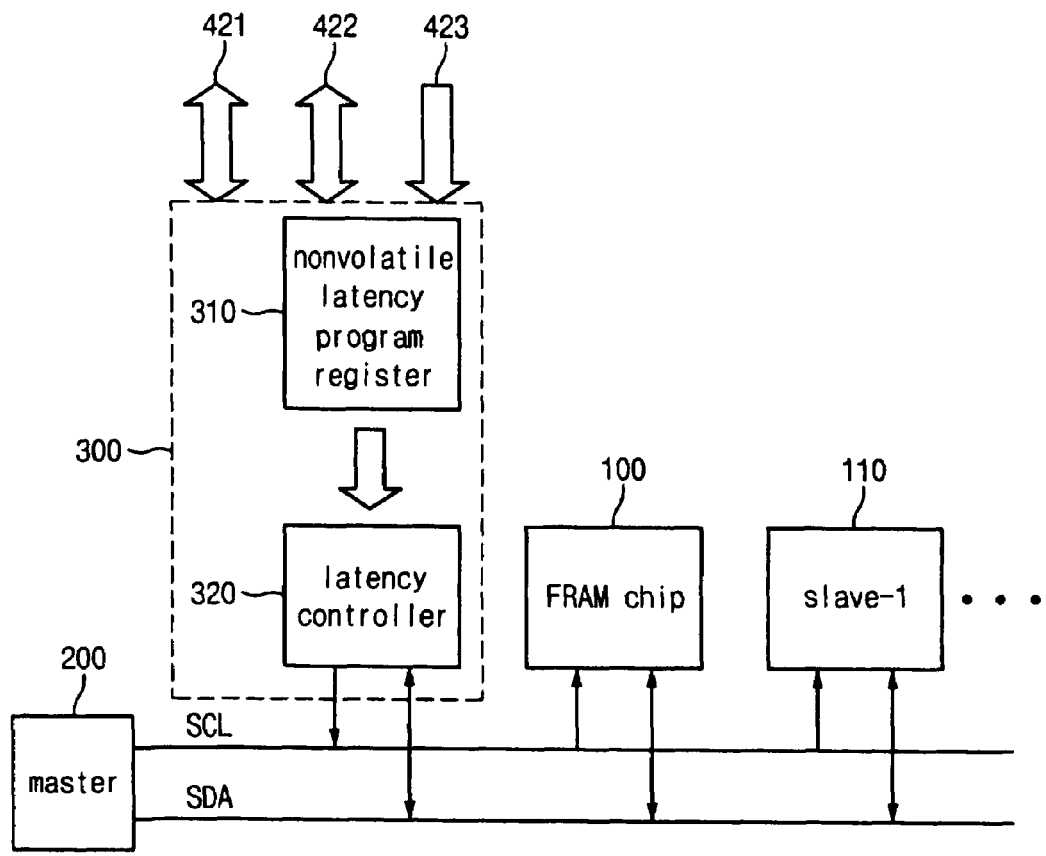
FIG. 7 is a block diagram illustrating a memory controller of FIG. 6.

FIG. 7 is a block diagram illustrating the memory controller 300 of FIG. 6.

The memory controller 300 comprises a nonvolatile latency program register 310 and a latency controller 320.

The nonvolatile latency program register 310 comprising a nonvolatile ferroelectric register stores program data to set latency time of row/column address.

The latency controller 320 compares a corresponding address with latency program data stored in the nonvolatile program register 310 to generate latency response control signal.

The memory controller 300 transmits data/control signal with the system controller 410 through a data bus 421 and a control bus 422. The memory controller 300 receives row/column address from the system controller 410 through an address bus 423.

Figure 8:
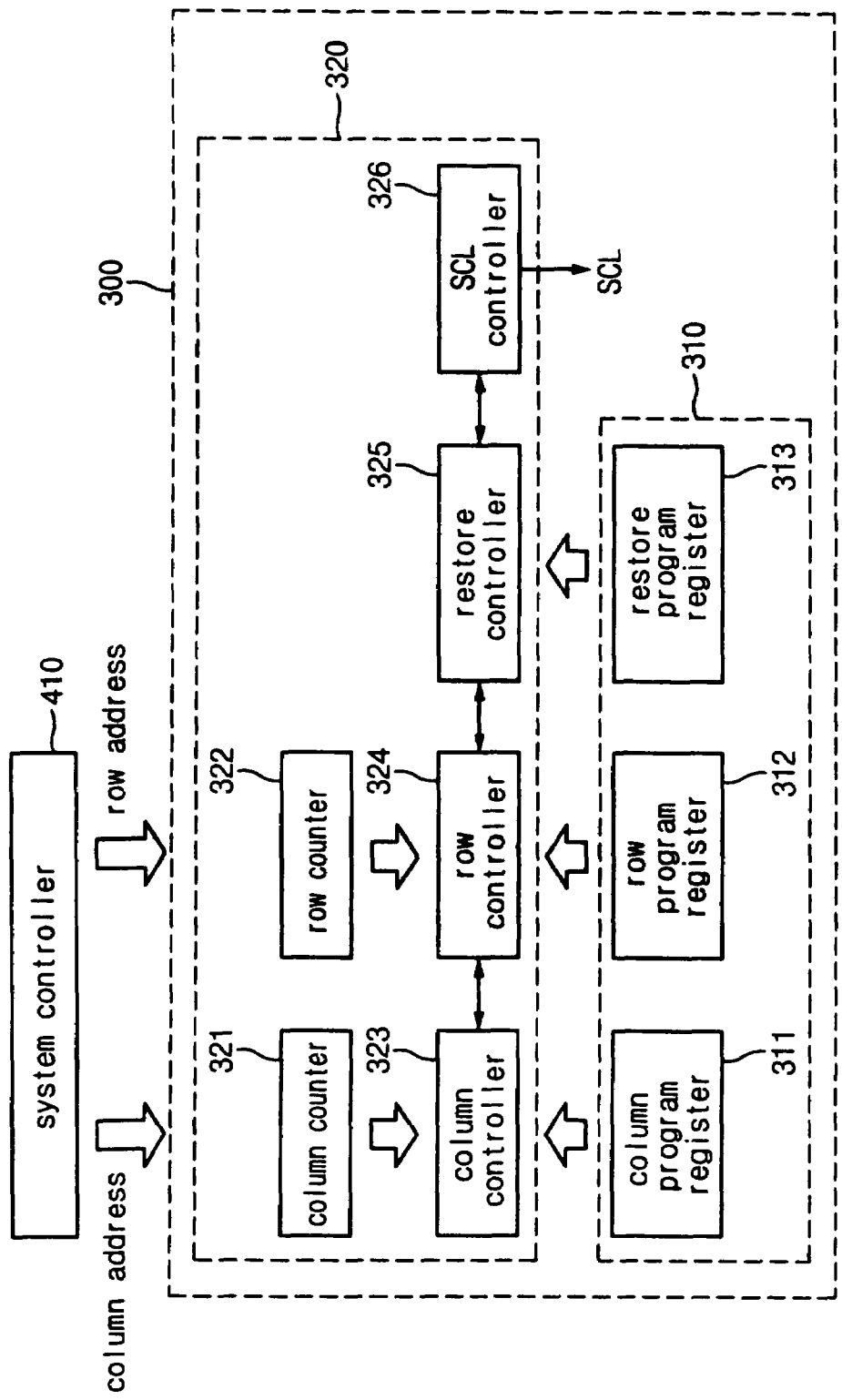
FIG. 8 is a detailed block diagram illustrating the memory controller of FIG. 7.

FIG. 8 is a detailed block diagram illustrating the memory controller 300 of FIG. 7.

The nonvolatile latency program register 310 comprises a column program register 311, a row program register 312 and a restore program register 313. A latency controller 320 comprises a column counter 321, a row counter 322, a column controller 323, a row controller 324, a restore controller 325 and a SCL controller 326.

The column counter 321 counts column addresses received from the system controller 410. The row counter 322 counts row addresses received from the system controller 410.

The column controller 323 compares column addresses received from the column program register 311 with column addresses received from the column counter 321 to control latency time. The row controller 324 compares row addresses received from the row program register 312 with row addresses received from the row counter 322 to control latency time. The restore controller 325 receives restore data received from the restore program register 313 to control latency time.

The SCL controller 326 outputs a serial clock signal SCL into a serial bus in response to control signals received from the column controller 323, the row controller 324 and the restore controller 325.

Figure 9:
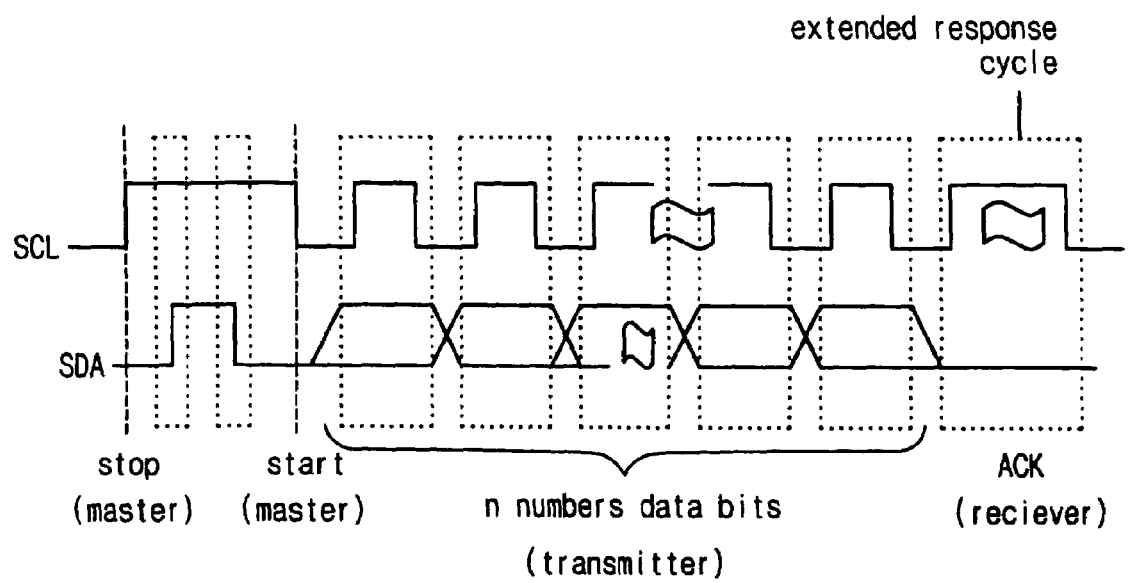
FIG. 9 is a diagram illustrating the data transmission protocol in a row access according to an embodiment of the present invention.
Figure 10:
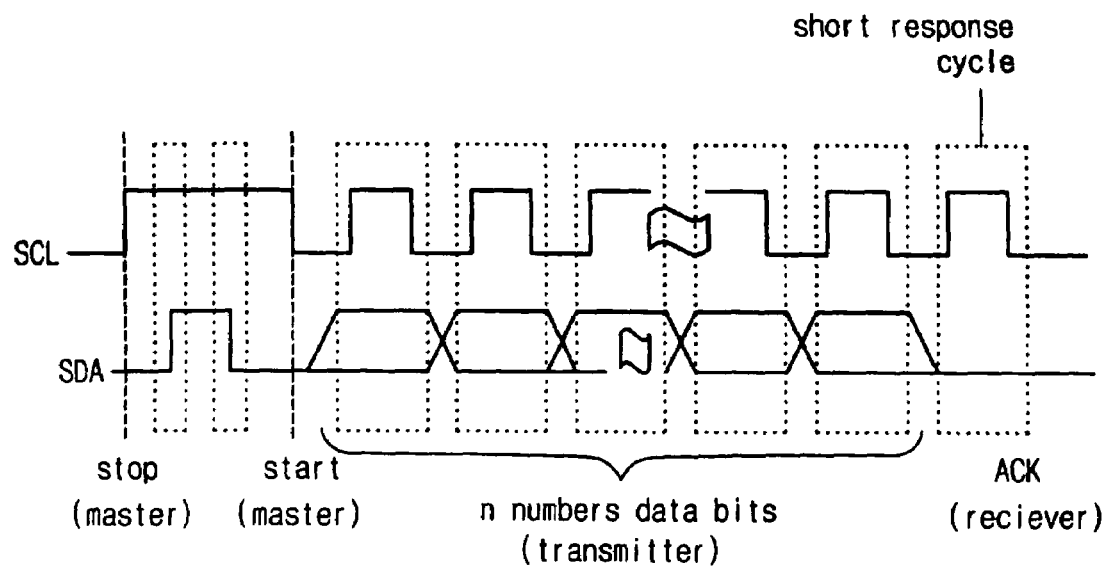
FIG. 10 is a diagram illustrating the data transmission protocol in a column access according to an embodiment of the present invention.

FIGS. 9 and 10 are diagrams illustrating the serial data transmission protocol when an address is accessed in the memory controller 300 according to an embodiment of the present invention.

A serial clock signal SCL is transmitted from the mater 200 through a serial bus. n serial data bits are received in the memory controller 300 in response to serial data/address SDA. The memory controller 300 transmits a response signal ACK to acknowledge completion of transmission of data into the FRAM chip 100 when data bits are transmitted.

As shown in FIG. 9, the memory controller 300 transmits the response signal ACK having an extended response cycle into the FRAM chip 100 if a received address is a row address. The FRAM chip 100 receives n serial data bits depending on control of the memory controller 300. A parallel/serial transmission controller 40 converts the n serial data bits into parallel data, and outputs the converted parallel data into a cell array block 12. The cell array block 12 performs read/write operations by byte width or word width.

The FRAM chip 100 performs read/write operations during the extended response cycle interval of the serial clock signal SCL received from the memory controller 300. The FRAM chip 100 performs read/write operations by applying the extended response cycle interval to an access interval or restore interval when a row addresses having long access time is accessed.

As shown in FIG. 10, the memory controller 300 transmits a response signal ACK having a short response cycle into the FRAM chip 100 if the received address is a column address. The FRAM chip 100 receives n serial data bits depending on control of the memory controller 300. A parallel/serial transmission controller 40 converts n serial data bits into parallel data, and outputs the converted parallel data into a cell array block 12. The cell array block 12 performs read/write operations by byte width or word width.

The FRAM chip 100 performs read/write operations during a short response cycle interval of the serial clock signal SCL received from the memory controller 300. The FRAM chip 100 performs read/write operations by applying the short response cycle interval when a column address having short access time is accessed.

Figure 11:
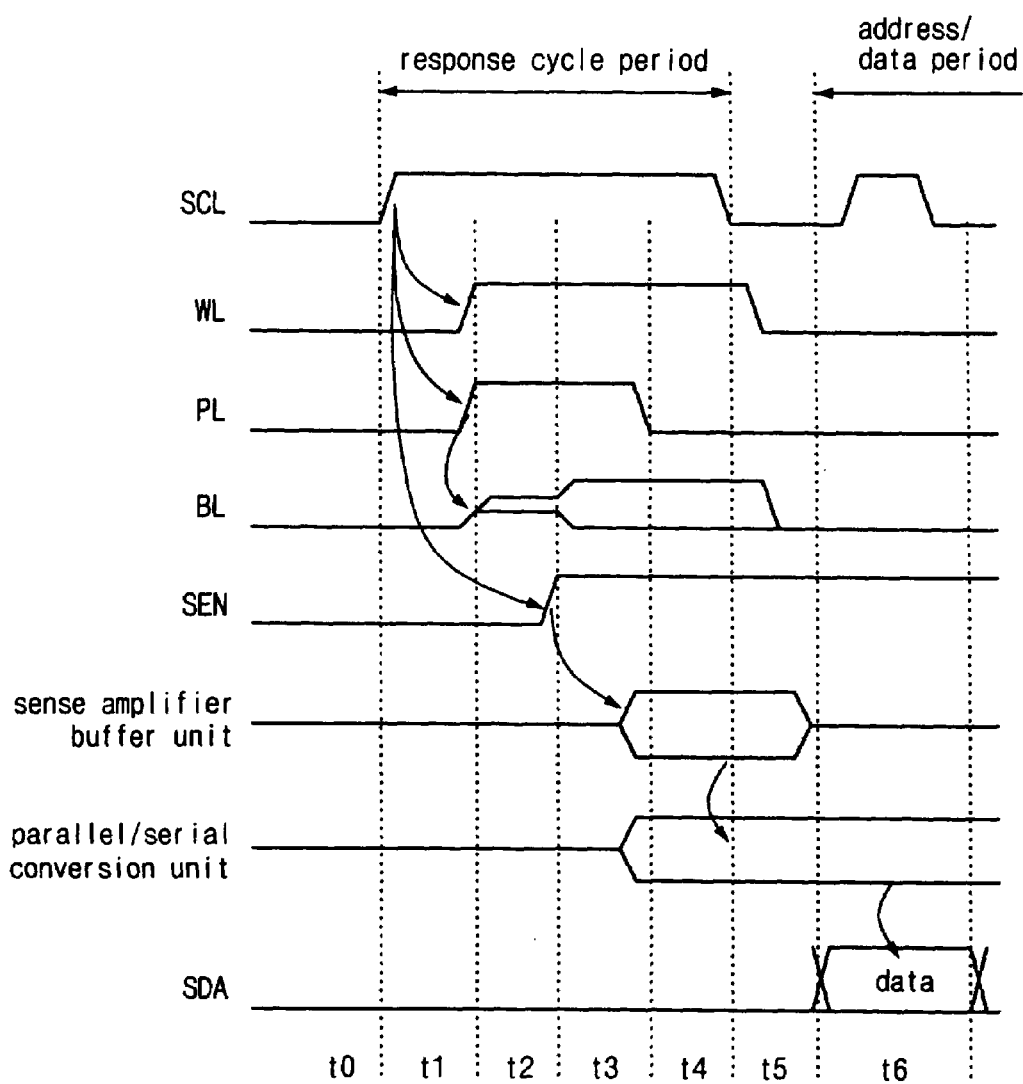
FIG. 11 is a timing diagram of the read operation of the memory controller according to an embodiment of the present invention.

FIG. 11 is a timing diagram of the read operation of the FRAM chip 100 according to an embodiment of the present invention.

In an interval t1 where a response cycle starts, the serial clock signal SCL is enabled. After a predetermined time, in an interval t2, a wordline WL and a plateline PL are enabled, and charges of a bitline BL are divided.

If a sense amplifier is enabled in response to a sense amplifier enable signal SEN in an interval t3, data are outputted from the cell array block 12 into a sense amplifier buffer unit 50 after a predetermined time. Data of byte width or word width are outputted from the sense amplifier buffer unit 50 into a parallel/serial conversion unit 42.

In an interval t4, a response cycle interval is completed, and the cell array block 12 is sensed and amplified in an interval t5. In an interval t6 which is an address/data interval, one row data is stored in the sense amplifier buffer unit 50.

In the interval t6, serial data/address SDA stored in the parallel/serial conversion unit 42 are outputted by one bit into a serial bus while the serial clock signal SCL has a high pulse. In the FRAM chip 100, time to read data is determined depending on a cycle of the response signal ACK controlled in the memory controller 300.

Figure 12:
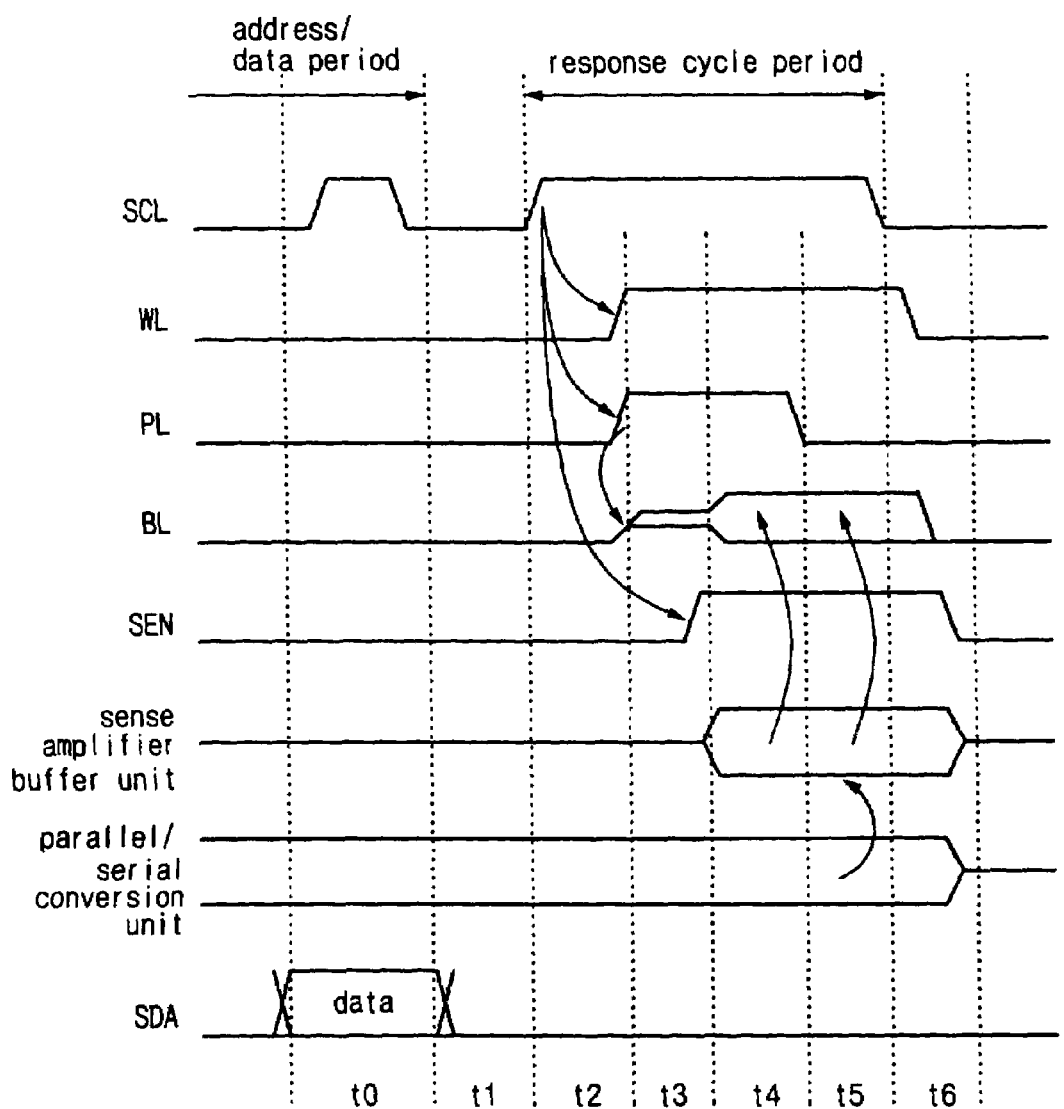
FIG. 12 is a timing diagram of the write operation of the memory controller according to an embodiment of the present invention.

FIG. 12 is a timing diagram of the write operation of the FRAM chip 100 according to an embodiment of the present invention.

In an interval t0, if the serial clock signal SCL is enabled, data to be written in the parallel/serial converter 42 as transmitted by one byte through a serial bus.

In an interval t2, when a response cycle interval starts, the serial clock signal SCL is enabled. In an interval t3, a wordline WL and a plateline PL are enabled. In an interval t4, if the sense amplifier enable signal SEN is enabled, charges of a bitline BL are divided.

During intervals t4~t6, data of the parallel/serial conversion unit 42 are outputted into the sense amplifier buffer unit 50. Data of the sense amplifier buffer unit 50 are written in the cell array block 12 through the bitline BL. Time to write data is determined in the FRAM chip 100 depending on a cycle of the response signal ACK controlled in the memory controller 300.

Figure 13:
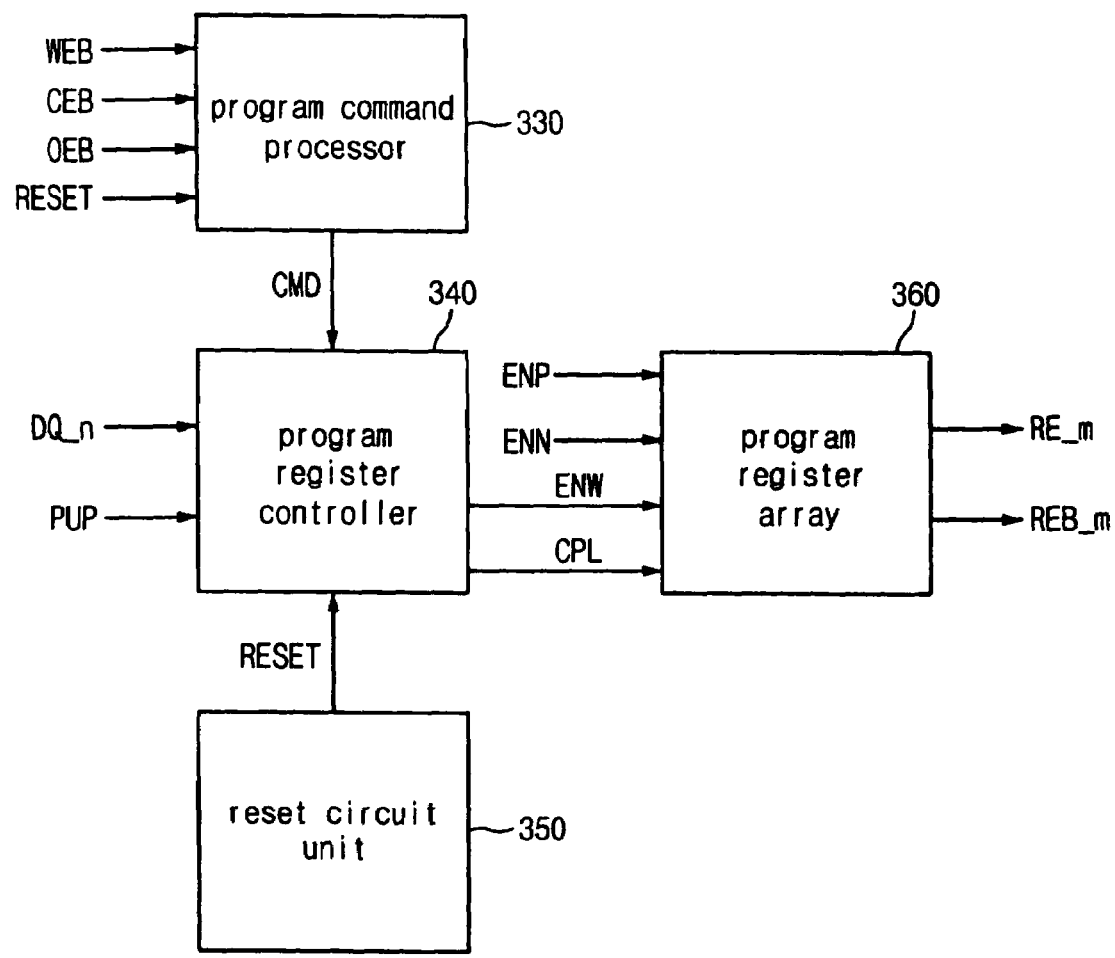
FIG. 13 is a block diagram illustrating a nonvolatile latency program register according to an embodiment of the present invention.

FIG. 13 is a block diagram illustrating a nonvolatile latency program register 310 according to an embodiment of the present invention.

The nonvolatile latency program register 310 comprises a program command processor 330, a program register controller 340, a reset circuit unit 350 and a program register array 360. The program command processor 330 codes program commands in response to a write enable signal WEB, a chip enable signal CEB, an output enable signal OEB and a reset signal RESET, and outputs a command signal CMD.

The program register controller 340 logically combines a command signal CMD, a power-up detecting signal PUP and an input data DQ_n, and outputs a write control signal ENW and a cell plate signal CPL.

The program register array 360 outputs control signals RE_m and REB_m in response to a pull-up enable signal ENP, a pull-down enable signal ENN, a write control signal ENW and a cell plate signal CPL. The reset circuit unit 350 outputs a reset signal RESET to initialize a register in a power-up mode into the program register controller 340.

When the command signal CMD is outputted from the program command processor 330, the program register controller 340 changes or sets configuration data of the program register array 360.

The reset circuit unit 350 outputs a reset signal RESET in a power-up mode to activate the program register controller 340. Control signals outputted from the program register controller 340 initiate nonvolatile data of the program register array 360.

Figure 14:
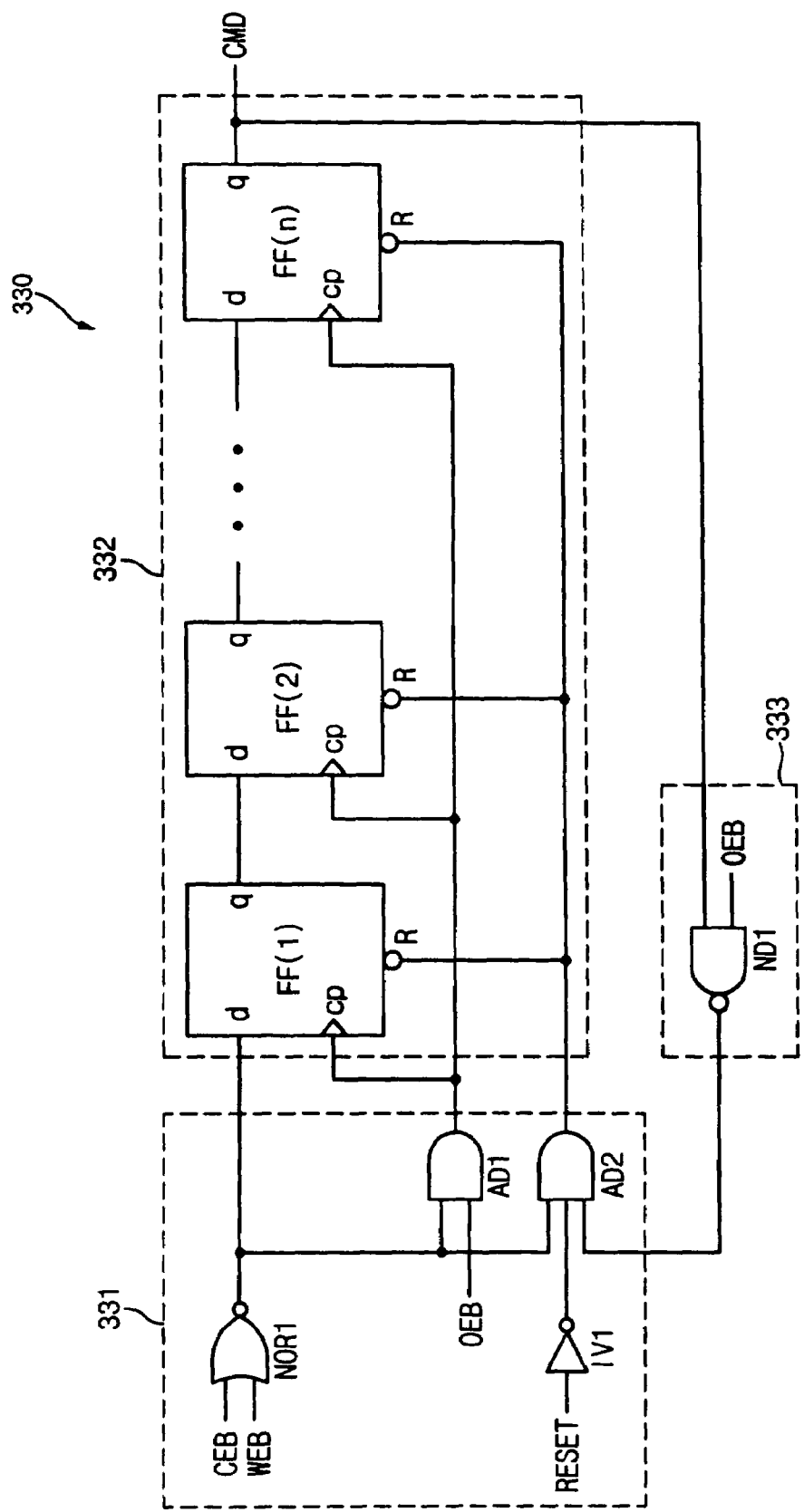
FIG. 14 is a circuit diagram illustrating a program command processor of FIG. 13.

FIG. 14 is a circuit diagram illustrating the program command processor 330 of FIG. 13.

The program command processor 330 comprises a logic unit 331, a flip-flop unit 332 and an overtoggle detecting unit 333.

The logic unit 331 comprises a NOR gate NOR1, AND gates AD1 and AD2 and an inverter IV1. The NOR gate NOR1 performs a NOR operation on the write enable signal WEB and the chip enable signal CEB. The AND gate AD1 performs an AND operation on an output signal of the NOR gate NOR1 and the output enable signal OEB. The AND gate AD2 performs an AND operation on an output signal of the NOR gate NOR1, the reset signal RESET inverted by the inverter IV1 and the overtoggle detecting unit 333.

The flip-flop unit 332 comprises a plurality of flip-flops FF. Each flip-flop FF has data input node d to receive an output signal from the NOR gate NOR1 and data output node q which are connected in series. A command signal CMD is outputted from an output terminal of the final flip-flop FF. Each flip-flop FF has a node cp to receive an activation synchronizing signal from the AND gate AD1 and a reset node R to receive a reset signal from the AND gate AD2.

The node cp of the flip-flop FF receives the output enable signal OEB when the chip enable signal CEB and the write enable signal WEB are at a low level. When one of the chip enable signal CEB and the write enable signal WEB is at a high level, the reset node R of the flip-flop FF receives a low level signal, and is reset. In the power-up mode, the flip-flop FF is reset in an interval where the reset signal RESET is at a high level.

The overtoggle detecting unit 333 comprises a NAND gate ND1 for performing a NAND operation on the command signal CMD and the output enable signal OEB. The overtoggle detecting unit 333 resets the flip-flop unit 332 when the output enable signal OEB exceeds n toggles to generate overtoggle. As a result, the number of toggles in the program command processor 330 is set to be varied.

Figure 15:
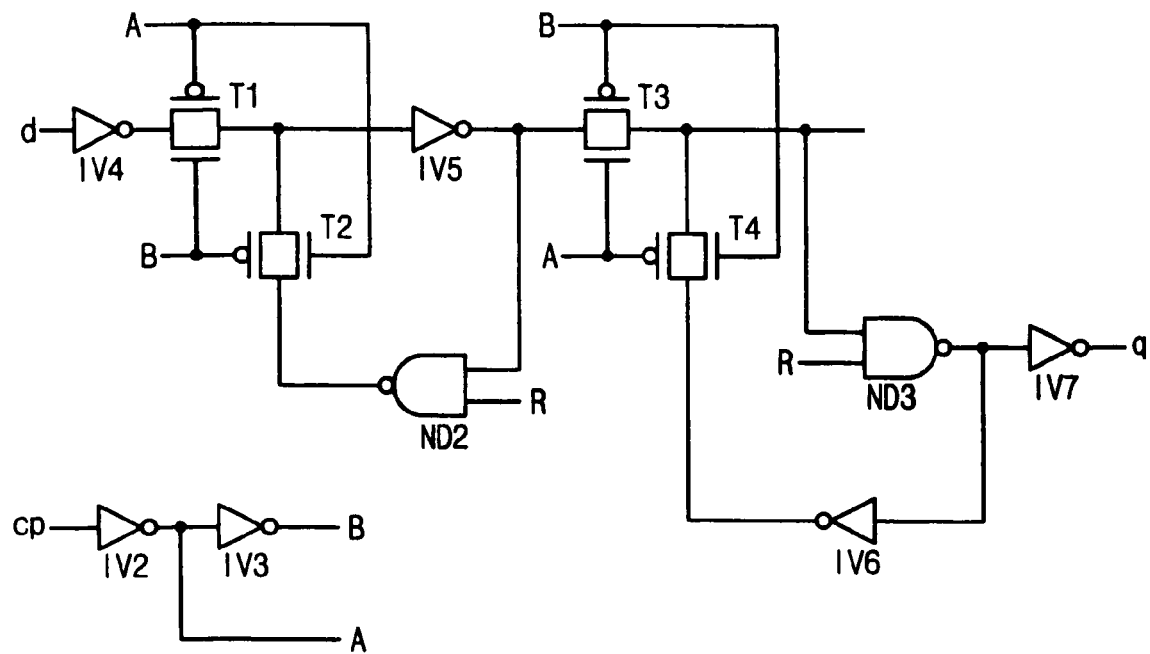
FIG. 15 is a circuit diagram illustrating a flip-flop of FIG. 14.

FIG. 15 is a circuit diagram illustrating the flip-flop FF of FIG. 14.

The flip-flop FF comprises transmission gates T1~T4, NAND gates ND2 and ND3 and inverters IV2~IV7. The inverter IV2 inverts an output signal of the node cp to output a control signal A. The inverter IV3 inverts an output signal of the inverter IV2 to output a control signal B.

The transmission gate T1 selectively outputs an output signal from the input node d inverted by the inverter Iv4 depending on state of the control signals A and B. The NAND gate ND2 performs a NAND operation on an output signal from the inverter IV5 and an output signal from the reset node R, and outputs the operation result into the transmission gate T2. The transmission gate T2 selectively outputs an output signal from the NAND gate ND2 depending on state of the control signal A and B.

The transmission gate T3 selectively outputs an output signal from the inverter IV5 depending on state of the control signals A and B. The NAND gate ND3 performs a NAND operation on an output signal from the transmission gate T3 and the output signal from the reset node R. The inverter IV6 inverts an output signal from the NAND gate ND3, and outputs the inverted output signal into a transmission gate T4. The transmission gate T4 selectively outputs an output signal from the inverter IV6 depending on state of the control signals A and B. An inverter IV7 inverts an output signal from the NAND gate ND3, and outputs the inverted output signal into the output node q.

Data inputted from the input node d moves rightward whenever the control signal inputted through the node cp toggles once. When a low level signal is inputted into the reset node R, a low level signal is outputted from the output node q to reset the flip-flop FF.

Figure 16:
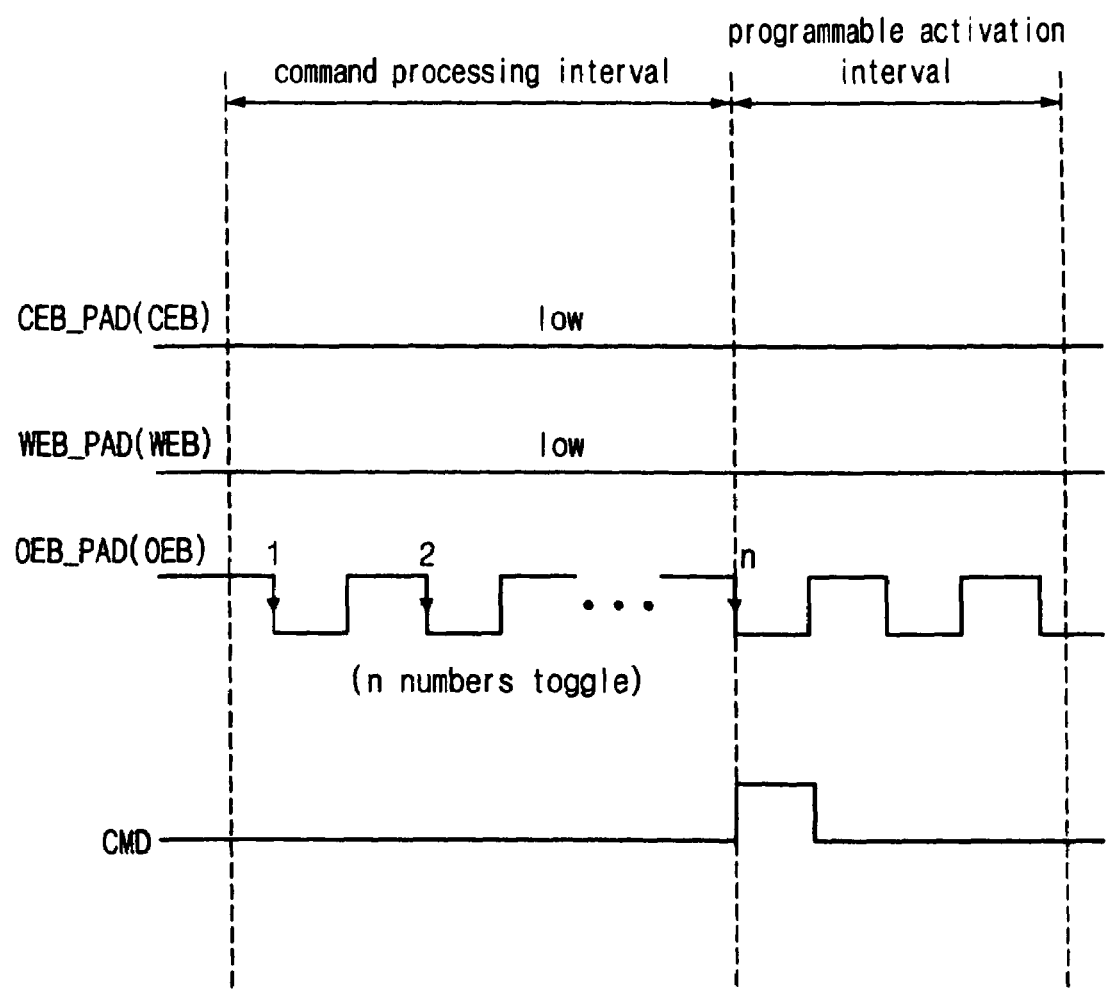
FIG. 16 is a timing diagram of the operation of the nonvolatile latency program register of FIG. 13.

FIG. 16 is a timing diagram of the operation of the nonvolatile latency program register 330 of FIG. 13.

In a command processing interval, the chip enable signal CEB and the write enable signal WEB are maintained at a low level. While the output enable signal OEB toggles n-times, the command signal CMD is maintained at a disable state.

Thereafter, when a programmable activation interval starts and the output enable signal OEB toggles n times, the command signal CMD is enabled to a high level. If the number of toggles of the output enable signal OEB is to be regulated, the number of flip-flops FF connected in series is regulated. In the programmable activation interval, when the output enable signal OEB toggles over n-times, the command signal CMD is disabled.

Figure 17:
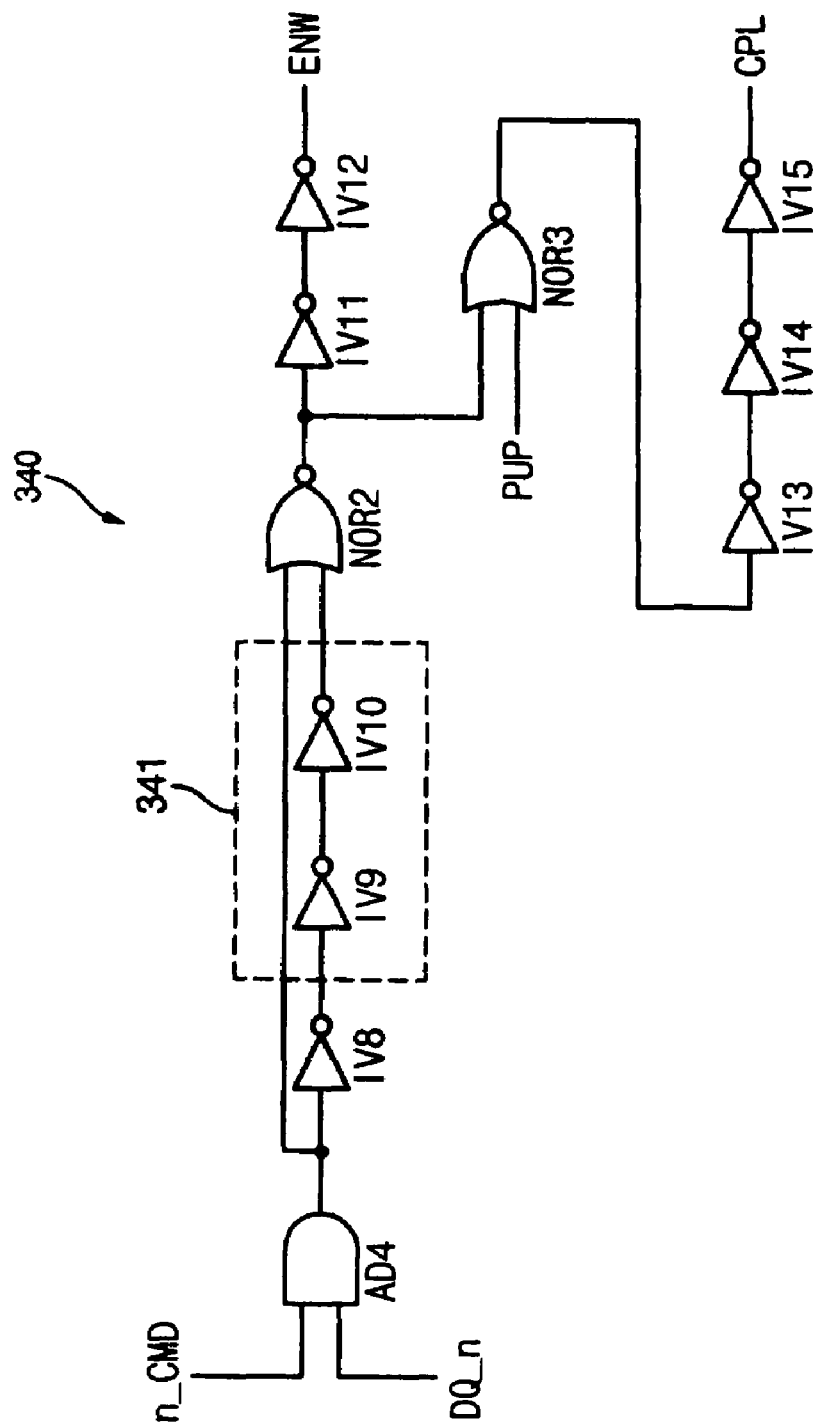
FIG. 17 is a circuit diagram illustrating a program register controller of FIG. 13.

FIG. 17 is a circuit diagram illustrating the program register controller 340 of FIG. 13.

The program register controller 340 comprises an AND gate AD4, inverters IV8~IV15, and NOR gates NOR2 and NOR3.

The AND gate AD4 performs an AND operation on the nth command signal n_CMD and input data DQ_n. The inverters IV8~IV10 invert and delay an output signal of the AND gate AD4. The NOR gate NOR2 performs a NOR operation on the output signal from the AND gate AD4 and an output signal from the inverter IV10. The inverters IV11 and IV12 delay an output signal from the NOR gate NOR2, and outputs a write control signal ENW.

The NOR gate NOR3 performs a NOR operation on the output signal from the NOR gate NOR2 and the power-up detecting signal PUP. The inverters IV13~IV15 invert and delay an output signal from the NOR gate NOR3, and outputs the cell plate signal CPL. The power-up detecting signal PUP is a control signal to re-set the register after data stored in the register which is initially reset are read.

After the nth command signal n_CMD is activated to a high level, the input data DQ_n is toggled by using an input pad. As a result, the write control signal ENW and the cell plate signal CPL which have a pulse width corresponding to delay time of a delay unit 341 are generated.

Figure 18:
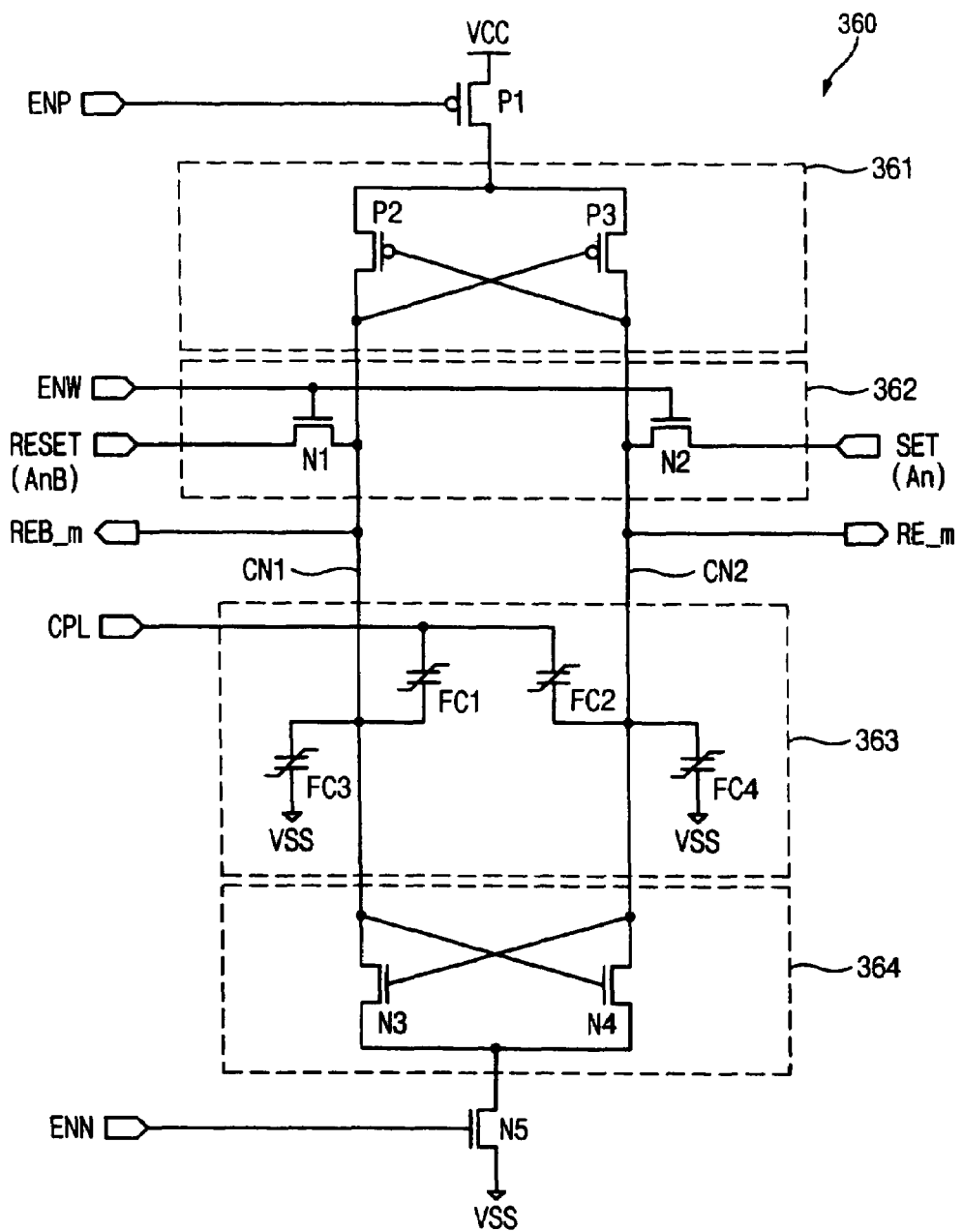
FIG. 18 is a circuit diagram illustrating a program register array of FIG. 13.

FIG. 18 is a circuit diagram illustrating the program register array 360 of FIG. 13.

The program register array 360 comprises a pull-up driver (PMOS transistor P1), a first driver unit 361, a write enable controller 362, a ferroelectric capacitor unit 363, a second driver unit 364, and a pull-down driver (NMOS transistor N5).

The PMOS transistor P1, connected between a power voltage VCC terminal and the first driver unit 361, has a gate to receive the pull-up enable signal ENP. The first driver unit 361 comprises PMOS transistors P2 and P3 having a latch structure. The PMOS transistor P2 has a gate connected to a drain of the PMOS transistor P3 while the PMOS transistor has a gate connected to a drain of the PMOS transistor P2.

The write enable controller 362 comprises NMOS transistors N1 and N2. The NMOS transistor N1, connected between a reset signal RESET input terminal and a node CN1, has a gate to receive the write control signal ENW. The NMOS transistor N2, connected between a set signal SET input terminal and a node CN2, has a gate to receive the write control signal ENW.

The ferroelectric capacitor unit 363 comprises ferroelectric capacitors FC1~FC4. The ferroelectric capacitor FC1 has one terminal connected to the node CN1 and the other terminal to receive the cell plate signal CPL. The ferroelectric capacitor FC2 has one terminal connected to the node CN2 and the other terminal to receive the cell plate signal CPL.

The ferroelectric capacitor FC3 is connected between the node CN1 and a ground voltage terminal, and the ferroelectric capacitor FC4 is connected between the node CN2 and the ground voltage terminal. The ferroelectric capacitors FC3 and FC4 may be selectively added depending on loading level control of both terminals of the cell.

The second driver unit 364 comprises NMOS transistors N3 and N4. The NMOS transistor N3 has a gate connected to a drain of the NMOS transistor N4 while the NMOS transistor N4 has a gate connected to a drain of the NMOS transistor N3.

The pull-down driver N5, connected between the second driver unit 364 and the ground voltage VSS terminal, has a gate to receive the pull-down enable signal ENN. The program register array 360 outputs the control RE_m and REB_m.

Figure 19:
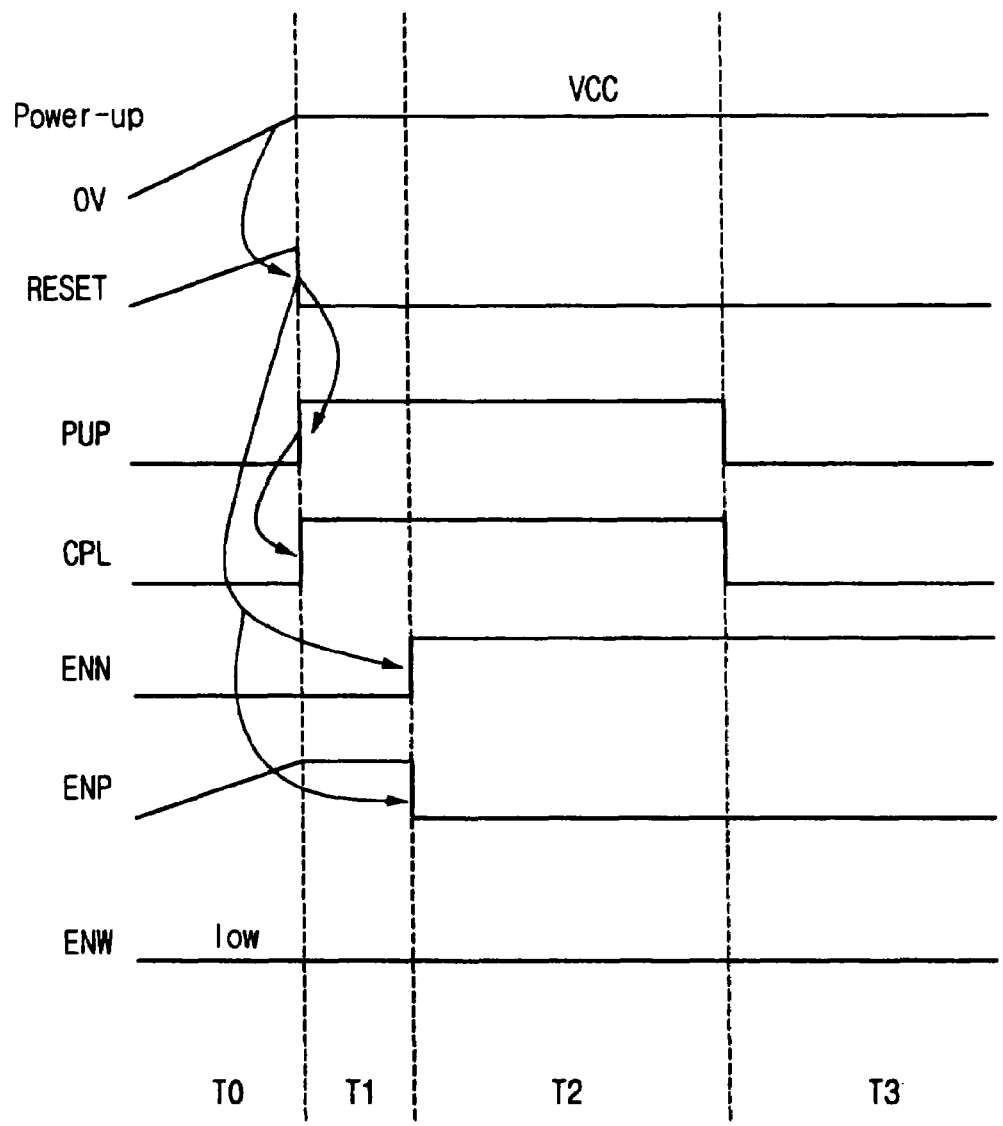
FIG. 19 is a timing diagram of the power-up mode according to an embodiment of the present invention.

FIG. 19 is a timing diagram of the read operation in the power-up mode according to an embodiment of the present invention.

In an interval T1 after power-up, when power reaches a stable power voltage VCC level, the reset signal RESET is disabled, and the power-up detecting signal PUP is enabled.

As the power-up detecting signal PUP is enabled, the cell plate signal CPL transits to a high level. Charges stored in the ferroelectric capacitors FC1 and FC2 of the program register array 360 generate voltage difference between the nodes CN1 and CN2 by capacitance load.

When an interval T2 where sufficient voltage different is generated in both nodes of the cell starts, the pull-down enable signal ENN is enabled to a high level, and the pull-up enable signal ENP is disabled to a low level, thereby amplifying data of the both terminals of the cell.

If an interval T3 starts and data amplification of both terminals of the cell is completed, the power-up detecting signal PUP and the cell plate signal CPL transit to the low level again. As a result, the destroyed high level data of the ferroelectric capacitor FC1 or FC2 are restored. Here, the write control signal ENW is maintained at a low state, thereby preventing external data from being written.

Figure 20:
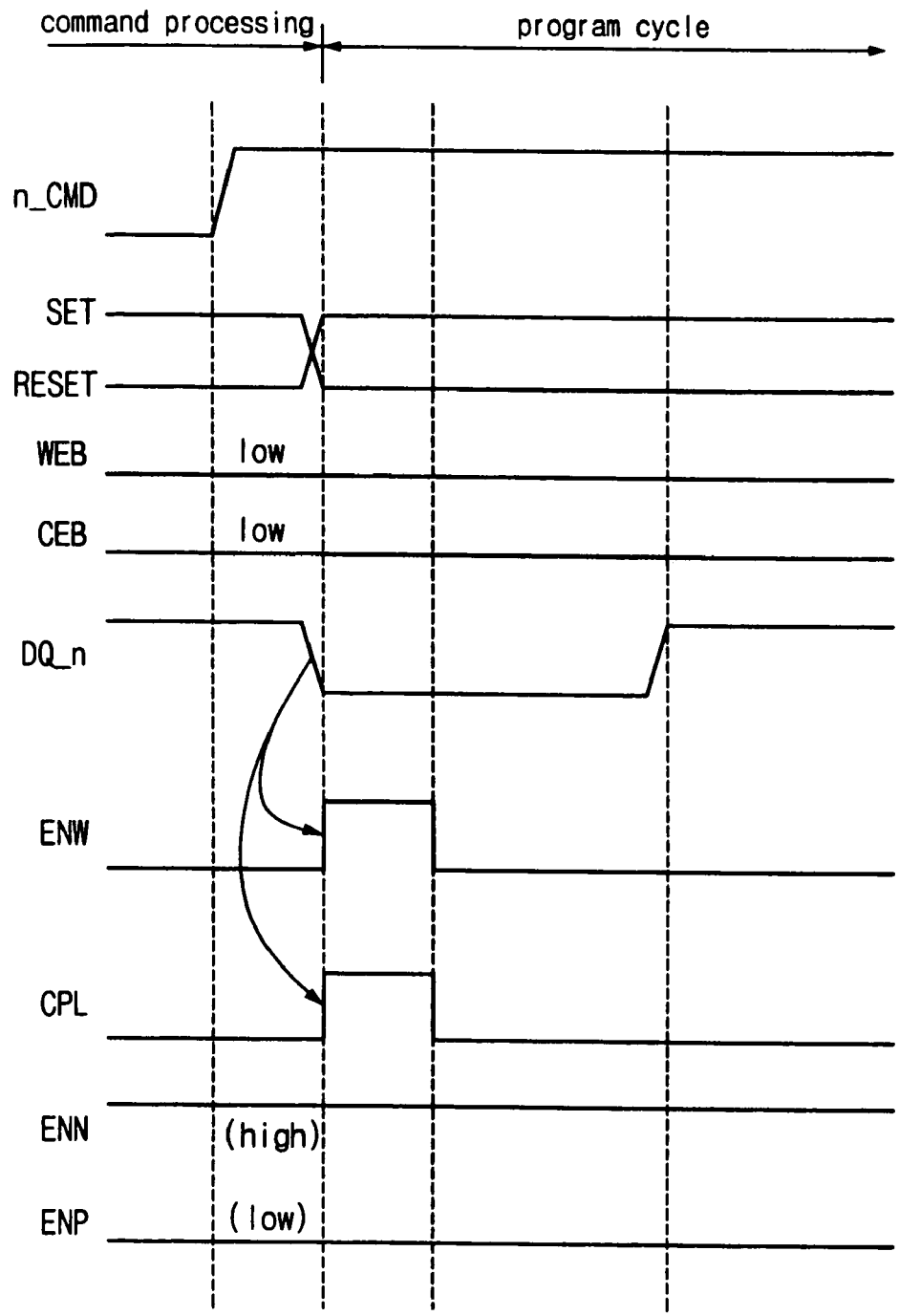
FIG. 20 is a timing diagram of the program mode according to an embodiment of the present invention.

FIG. 20 is a timing diagram of the operation to set new data in the program register in a program mode after the nth command signal n_CMD is activated to a high level according to an embodiment of the present invention.

After the nth command signal n_CMD is enabled to the high level and a predetermined time passes, the set signal SET and the reset signal RESET are inputted. If the input data DQ_n applied from the data input/output pad are disabled from a high to low level, the program cycle starts and the write control signal ENW to write new data in the register and the cell plate signal CPL transit to a high level.

The pull-down enable signal ENN is maintained at a high level, and the pull-up enable signal ENP is maintained at a low level. When the nth command signal n_CMD is inputted as a high level in the program register controller 340, signal input from the program command processor 330 is prevented. As a result, the program operation can be performed when control command is no more inputted.

As discussed earlier, a serial bus controller using a nonvolatile ferroelectric memory controls access time by addresses differently when data are exchanged through a serial bus, thereby improving system performance.

What is claimed is:

1. A serial bus controller using a nonvolatile ferroelectric memory, comprising:
    a memory controller for programming a code to control access latency time differently according to kinds of address in a nonvolatile ferroelectric memory and outputting a response signal to confirm completion of transmission of serial data/address when the serial data/address are transmitted in response to serial clock signals received through a serial bus; and
    a FRAM chip for performing read/write operations of the memory during a pulse interval of the response signal,
    wherein the memory controller controls the pulse interval of the response signal with a first cycle when a row address is transmitted, and controls the pulse interval of the response signal with a second cycle shorter than the first cycle when a column address is transmitted.

2. The serial bus controller according to claim 1, wherein the memory controller controls the pulse interval of the response signal with the first cycle in a restore interval of the FRAM chip.

3. The serial bus controller according to claim 1, wherein the FRAM chip comprises:
    a sense amplifier buffer unit for amplifying data applied from a plurality of cell array blocks;
    a data bus unit for exchanging inter-data between the plurality of cell array blocks and the sense amplifier buffer unit;
    a data input/output buffer unit for buffering data inputted/outputted in the data bus unit;
    a parallel/serial conversion controller for interconverting serial data inputted corresponding to serial clock signals with parallel data applied from the data input/output buffer unit; and
    a write protecting controller for preventing data from being written in a corresponding sector of the plurality of cell array blocks when a write protecting command is set.

4. The serial bus controller according to claim 3, wherein the parallel/serial conversion controller comprises:
    a counter for counting a corresponding address when consecutive address/data are transmitted in a burst mode; and
    a parallel/serial conversion unit for interconverting the serial data with the parallel data.

* * * * *